(12) United States Patent
Cullen

(10) Patent No.: US 8,228,115 B1
(45) Date of Patent: Jul. 24, 2012

(54) CIRCUIT FOR BIASING A WELL FROM THREE VOLTAGES

(75) Inventor: Edward Cullen, Clane (IE)

(73) Assignee: Xilinx, Inc., San Jose, CA (US)

( * ) Notice: Subject to any disclaimer, the term of this patent is extended or adjusted under 35 U.S.C. 154(b) by 457 days.

(21) Appl. No.: 12/489,307

(22) Filed: Jun. 22, 2009

(51) Int. Cl.
*H03K 17/00* (2006.01)
*H03K 3/01* (2006.01)

(52) U.S. Cl. ......... 327/537; 327/407; 327/408; 327/534

(58) Field of Classification Search .................. 327/407, 327/408, 534, 537
See application file for complete search history.

(56) References Cited

U.S. PATENT DOCUMENTS

| | | | |
|---|---|---|---|
| 7,423,472 B2 * | 9/2008 | Hirose et al. | 327/407 |
| 7,612,604 B2 * | 11/2009 | Miyazaki et al. | 327/534 |
| 7,746,154 B2 * | 6/2010 | Merandat et al. | 327/408 |
| 7,924,085 B2 * | 4/2011 | Guo | 327/534 |
| 2006/0214722 A1 * | 9/2006 | Hirose et al. | 327/407 |
| 2009/0278571 A1 * | 11/2009 | Pietri et al. | 327/50 |

* cited by examiner

*Primary Examiner* — Patrick O'Neill
(74) *Attorney, Agent, or Firm* — LeRoy D. Maunu

(57) ABSTRACT

A biasing circuit of an integrated circuit includes a well of the integrated circuit and a plurality of transistors disposed in the well. The transistors couple the well to three signals providing corresponding voltages. The transistors bias the well to an extreme one of the corresponding voltages for the three signals.

17 Claims, 3 Drawing Sheets

CIRCUIT FOR BIASING A WELL FROM THREE VOLTAGES

FIELD OF THE INVENTION

The present invention generally relates to voltage biasing, and more particularly to voltage biasing of wells of integrated circuits.

BACKGROUND

Complementary metal-oxide semiconductor (CMOS) integrated circuits frequently include wells formed in the substrate. CMOS integrated circuits include n-channel transistors formed in the substrate and p-channel transistors formed in the wells, or vice versa.

Integrated circuits can include bipolar transistors instead of or in addition to CMOS transistors. Frequently, these integrated circuits also include wells formed in the substrate. The bipolar transistors can include NPN transistors formed in the substrate and PNP transistors formed in the wells, or vice versa.

Parasitic diodes and parasitic transistors can form in integrated circuits that include wells. Proper biasing of the wells is required to limit the harmful effects of these parasitic diodes and parasitic transistors.

The present invention may address one or more of the above issues.

SUMMARY

An embodiment of the invention provides a biasing circuit of an integrated circuit. The biasing circuit includes a well of the integrated circuit and a plurality of transistors disposed in the well. The transistors couple the well to three signals providing corresponding voltages. The transistors bias the well to an extreme one of the corresponding voltages for the three signals.

In this embodiment, the plurality of transistors can bias the well to prevent forward biasing of a plurality of parasitic diodes. The circuit can further comprise an additional plurality of transistors that are disposed in the well and have source and drain electrodes that are coupled to the three signals, wherein each of the parasitic diodes couples one of the source and drain electrodes to the well. The three signals can include a power supply signal and two input signals, and the plurality of transistors can bias the well to prevent forward biasing of the parasitic diodes in response to the corresponding voltage of at least one of the input signals exceeding the corresponding voltage of the power supply signal. The two input signals can be two inputs of the integrated circuit.

The three signals can include two power supply signals and an input signal, and the plurality of transistors can bias the well to prevent forward biasing of the parasitic diodes in response to the corresponding voltage of the input signal exceeding the corresponding voltage of both of the power supply signals or in response to the corresponding voltage of one of the power supply signals exceeding the corresponding voltages of the input signal and another one of the power supply signals.

The three signals can include a power supply signal and two input signals, and the plurality of transistors can bias the well to prevent forward biasing of the parasitic diodes in response to the corresponding voltage of at least one of the input signals exceeding the corresponding voltage of the power supply signal. The two inputs can be two inputs of the integrated circuit. The three signals can include two power supply signals and an input signal, and the plurality of transistors can bias the well to prevent forward biasing of the parasitic diodes in response to the corresponding voltage of the input signal exceeding the corresponding voltage of both of the power supply signals or in response to the corresponding voltage of one of the power supply signals exceeding the corresponding voltages of the input signal and another one of the power supply signals. The transistors can couple the well to the signal having the extreme corresponding voltage in response to a bias voltage of the well differing from the extreme corresponding voltage.

The well can be an n-type well and the transistors can be p-channel field-effect transistors disposed in the n-type well and coupling the n-type well to the three signals for biasing the n-type well to the extreme corresponding voltage that is a highest one of the corresponding voltages for the three signals. The well can be a p-type well and the transistors can be n-channel field-effect transistors disposed in the p-type well and coupling the p-type well to the three signals for biasing the p-type well to the extreme corresponding voltage that is a lowest one of the corresponding voltages for the three signals. The transistors can be metal-oxide-semiconductor (MOS) transistors having a base electrode that is coupled to the well. The transistors can be adapted to bias the well with sufficient current to overcome a leakage current from the well.

The transistors can include, for the three signals, respective field-effect transistors and respective pairs of field-effect transistors, the respective field-effect transistor for each of the three signals coupled between the well and the signal through source and drain electrodes of the respective transistor, the respective pair of field-effect transistors for each of the three signals coupled in series between the well and the signal through source and drain electrodes of the respective pair of field-effect transistors. For each of the three signals, the well can be coupled to a gate electrode of the respective field-effect transistor for the signal, and the three signals other than the signal are coupled to a gate electrode of respective ones of the field-effect transistors in the respective pair.

The respective field-effect transistors for the three signals can couple the well to the signal having the extreme corresponding voltage in response to the extreme corresponding voltage exceeding a bias voltage of the well, and the respective pair of field-effect transistors for the three signals can couple the well to the signal having the extreme corresponding voltage in response to the extreme corresponding voltage being exceeded by the bias voltage of the well.

The respective pair of field-effect transistors for the three signals can couple the well to the signal having the extreme corresponding voltage in response to the extreme corresponding voltage exceeding the bias voltage of the well and both of the corresponding voltages of the three signals other than the signal.

Another embodiment of the invention provides a biasing circuit of an integrated circuit. The circuit includes a well of the integrated circuit, three pairs of transistors corresponding to the three input signals, and three field-effect transistors corresponding to the three input signals. The three pairs include first and second field-effect transistors disposed in the well. Each field-effect transistor of each pair has source and drain electrodes and gate and base electrodes. For the two input signals that are the three input signals other than the input signal corresponding to each pair, these two input signals are respectively coupled to the gate electrode of the field-effect transistors of the pair, and the corresponding input signal for the pair is coupled to the source electrode of the first field-effect transistor of the pair. The drain electrode of the first field-effect transistor of each pair is coupled to the source electrode of the second field-effect transistor of the pair. The well is coupled to the drain electrode of the second field-effect transistor of each pair and the base electrode of each transistor of each pair too. The three field-effect transistors corresponding to the three input signals are disposed in the well and have source and drain electrodes and gate and base electrodes, with the well coupled to the drain electrode and the gate and base electrodes of each of these field-effect transistors. The corresponding input signal is coupled to the source electrode of each of these field-effect transistors.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

Figure 1:
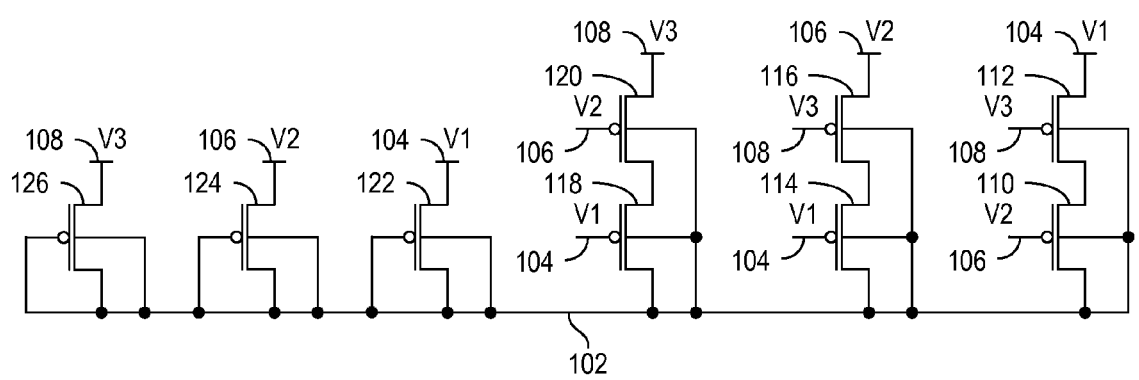
FIG. 1 is a block diagram of a circuit for biasing a well of an integrated circuit in accordance with various embodiments of the invention.

FIG. 1 is a block diagram of a circuit for biasing a well of an integrated circuit in accordance with one or more embodiments of the invention. The circuit biases the well voltage at the node on line 102 to a higher one of three input voltages of the nodes on lines 104, 106, and 108. For clarity, four lines have reference 104 in FIG. 1, but these four lines are for a single electrical node providing one of the input voltages. Similarly, four lines have reference 106 and four lines have reference 108, with the electrical node of lines 106 and the electrical node of lines 108 providing the other two input voltages.

The biasing circuit includes nine transistors 110, 112, 114, 116, 118, 120, 122, 124, and 126. Because transistors 110 through 126 are in the well, transistors 110 through 126 have a base electrode coupled to the well node on line 102. In another embodiment, some or all of transistors 110 through 126 are in one or more additional physical wells, but the well node on line 102 is electrically coupled to corresponding well nodes of the other physical wells to create a single logical well.

Transistors 110 and 112 are series connected to couple the input voltage on lines 104 to the well node on line 102. The input voltage on lines 104 is connected to the source electrode of transistor 112, the drain electrode of transistor 112 is connected to the source electrode of transistor 110, and the drain electrode of transistor 110 is connected to the well node on line 102. The gate electrode of transistor 110 is connected to the input voltage on lines 106, and the gate electrode of transistor 112 is connected to the input voltage on lines 108.

If the input voltages on lines 106 and 108 are less than the input voltage on lines 104, then transistors 110 and 112 turn on and charge the well node on line 102 to the input voltage on lines 104. If both the input voltages on lines 106 and 108 are less than the input voltage on lines 104 by more than the threshold voltage of transistors 110 and 112, then transistors 110 and 112 remain on when the well node on line 102 fully charges to the input voltage on lines 104. If the input voltages on lines 106 and 108 are slightly less than the input voltage on lines 104, then transistors 110 and 112 charge the well node on line 102 towards the input voltage on lines 104, but transistors 110 and 112 might not fully charge the well node on line 102 to the input voltage on lines 104.

Similarly, the pair of transistors 114 and 116 charge the well node on line 102 to the input voltage on lines 106 when the input voltages on lines 104 and 108 are less than the input voltage on lines 106, and the pair of transistors 118 and 120 charge the well node on line 102 to the input voltage on lines 108 when the input voltages on lines 104 and 106 are less than the input voltage on lines 108. In summary, if one of the input voltages on lines 104, 106, or 108 is higher than the others, the well node on line 102 charges to this higher input voltage through one of the pairs of transistors 110 and 112, 114 and 116, or 118 and 120.

If one of the input voltages on lines 104, 106, or 108 is not higher than the others, then two input voltages are the same and higher than the other input voltage, or all three input voltages are the same. For example, if the input voltages on lines 106 and 108 have the same voltage higher than the input voltage on lines 104, then transistors 110, 112, 116, and 120 are turned off, and none of the pairs of transistors 110 and 112, 114 and 116, or 118 and 120 charge the well node on line 102, regardless of the voltage of the well node on line 102. In general, if multiple input voltages on lines 104, 106, or 108 have the highest input voltage, then none of the pairs of transistors 110 and 112, 114 and 116, or 118 and 120 charge the well node on line 102.

Transistors 122, 124, and 126 couple the input voltages on lines 104, 106, and 108 to the well node on line 102. The input voltage on lines 104 is connected to the source electrode of transistor 122, and the drain and gate electrodes of transistor 122 are connected to the well node on line 102. Transistor 122 charges the well node on line 102 towards the input voltage on lines 104 until the voltage of the well node on line 102 is a threshold voltage of transistor 122 below the input voltage on lines 104. Similarly, transistors 124 and 126 charge the well node on line 102 towards the input voltages on lines 106 and 108, respectively. Together, transistors 122, 124, and 126 charge the well node on line 102 within a threshold voltage of the highest input voltage on lines 104, 106, and 108.

In summary, transistors 110 through 126 charge the well node on line 102 to the highest input voltage on lines 104, 106, and 108 when the second highest input voltage on lines 104, 106, and 108 is more than threshold voltage below the highest input voltage, and when the second highest input voltage is an incremental voltage above a voltage that is a threshold voltage below the highest input voltage, the transistors 110 through 126 charge the well node on line 102 to this incremental voltage below the highest input voltage. It will be appreciated that sub-threshold conduction of transistors 110 through 126 will fully change the well node on line 102 when the leakage current from the well is sufficiently low even though the second highest input voltage is within a threshold voltage of the highest input voltage.

In one embodiment, the source and drain electrodes of transistors 110 through 126 are symmetrical and the source and drain designations depend upon the direction of current flow. The source and drain electrodes switch when the direction of current flow changes. In one example, the input voltage on lines 104 is a dynamic logic signal, and the input voltages on lines 106 and 108 are two different power supply voltages. If the dynamic logic signal has a high logic voltage on lines 104 higher than both power supply voltages on lines 106 and 108, then the well node on line 102 charges through transistors 110 and 112 to this high logic voltage on lines 104.

If the dynamic logic signal switches to a low logic voltage at ground potential, current flows temporarily in a reverse direction from the well node on line 102 through pair of transistors 114 and 116 and through pair of transistors 118 and 120 until the well voltage on line 102 discharges to the higher of the power supply voltages on lines 106 and 108. Thus, the source and drain designations are interchangeable for transistors 110 through 120. In this example, the source and drain electrodes of transistors 122, 124, and 126 would also switch even though these transistors would not turn on. In summary, the source and drain designations are interchangeable for all the transistors 110 through 126.

While in one embodiment p-type field effect transistors bias an n-type well to the highest of three input voltages, in another similar embodiment n-type field effect transistors bias a p-type well to the lowest of three input voltages. Thus, transistors bias a well to an extreme one of three input voltages in various embodiments.

Figure 2:
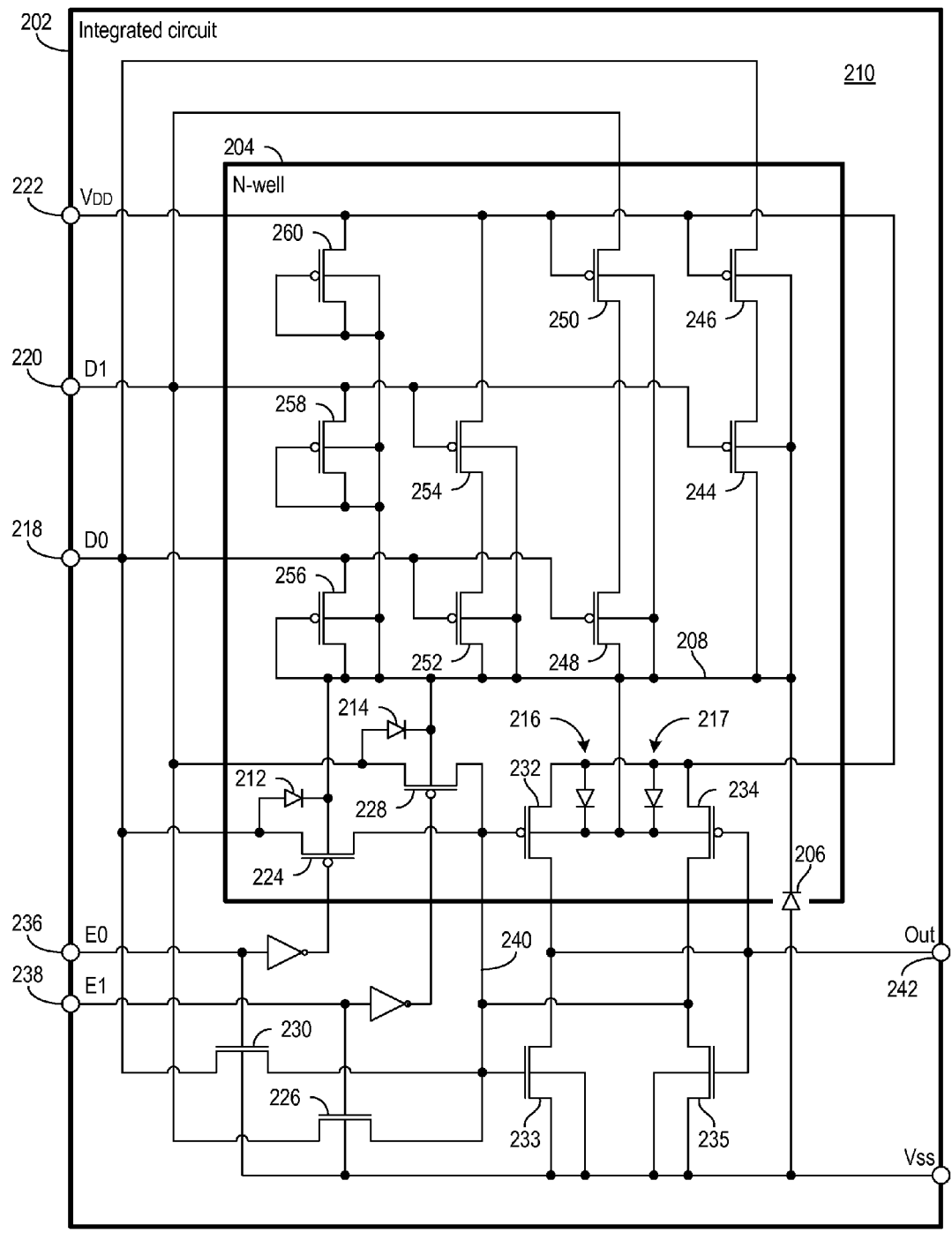
FIG. 2 is a block diagram of an example integrated circuit having a well biased in accordance with various embodiments of the invention.

FIG. 2 is a block diagram of an example integrated circuit 202 having a well 204 biased in accordance with one or more embodiments of the invention. A biasing circuit reverse biases the isolation diode 206 formed between the well node 208 of well 204 and the substrate 210 of the integrated circuit 202. The biasing circuit biases well 204 to prevent forward biasing of parasitic diodes 212, 214, 216, and 217 in a logic circuit of the example integrated circuit 202. The well node 208 cannot be tied to the power supply of input signal 222 because then the parasitic diodes 212 and 214 would become forward biased when the input signals 218 and 220 exceed the voltage of the power supply of input signal 222. The biasing circuit biases well 204 to prevent forward biasing of parasitic diodes 212, 214, 216 and 217 even when input signals 218 and/or 220 exceed the voltage of the power supply of input signal 222.

The example integrated circuit 202 implements a two-input register in transistors 224, 226, 228, 230, 232, 233, 234, and 235. Register enable inputs 236 and 238 control pass transistors 224, 226, 228, and 230. Pass transistors 224 and 230 connect input signal 218 to the node on line 240 when enable input 236 is asserted, and pass transistors 226 and 228 connect input signal 220 to the node on line 240 when enable input 238 is asserted. Transistors 232 and 233 form an inverter amplifying the selected input signal at line 240 to generate the output signal 242. When enable inputs 236 and 238 are both not asserted, transistors 234 and 235 form a weak inverter that keeps the current value of the node on line 240 until this current value is overdriven from input signal 218 or 220. Thus, the node on line 240 is driven to the power supply of input signal 222 when data is being held in the register, and the node on line 240 is driven to the voltage of input signals 218 or 220 when data is stored in the register.

During operation of the register of transistors 224, 226, 228, 230, 232, 233, 234, and 235, the parasitic diodes 216 and 217 become forward biased when the power supply of input signal 222 exceeds the well node on line 208. Similarly, the parasitic diode 212 becomes forward biased when the input signal 218 exceeds the well node on line 208, and the parasitic diode 214 becomes forward biased when the input signal 220 exceeds the well node on line 208. Parasitic diode 212 couples a source or drain electrode of transistor 224 to the well node 208. Parasitic diodes 214, 216 and 217 similarly couple a source or drain electrode of transistors 228, 232, and 234 to well node 208.

Transistors 244, 246, 248, 250, 252, 254, 256, 258, and 260 bias the well 204 to prevent forward biasing of parasitic diodes 212, 214, 216, and 217 during operation of the register. Prevention of forward biasing of parasitic diodes 212, 214, 216, and 217 eliminates certain harmful effects including extra leakage currents and injection of minority carriers into well 204.

In a similar manner to transistors 110 through 126 of FIG. 1, transistors 244 through 260 bias the well 204 to a maximum of the voltages supplied at input signals 218, 220, and 222. This prevents forward biasing of the parasitic diodes 212, 214, 216, and 217.

It will be appreciated that biasing transistors 244 through 260 in the well 204 also have parasitic diodes similar to parasitic diodes 212, 214, 216, and 217 of transistors 224, 228, 232, and 234. However, the biasing of well 204 also prevents forward biasing of these additional parasitic diodes.

In one embodiment, the transistors 244 through 260 are sized to bias the well 204 with sufficient current to overcome the leakage current through the isolation diode 206. The transistors 244 through 260 are sized to supply sufficient current for the worst case of two of the input signals 218, 220, and 222 providing the same voltage that is higher than the voltage of the remaining input signal.

In certain embodiments, the well 204 is an n-type well and the bias transistors 244 through 260 are p-channel MOS field-effect transistors in the n-type well 204. The transistors 244 through 260 couple the well node 208 of the n-type well 204 to the three signals 218, 220, and 222 to bias the n-type well 204 to the highest voltage of the three signals 218, 220, and 222. In certain other embodiments, the well 204 is a p-type well and the bias transistors 244 through 260 are n-channel MOS field-effect transistors biasing the p-type well 204 to the lowest voltage of the three signals 218, 220, and 222.

Figure 3:
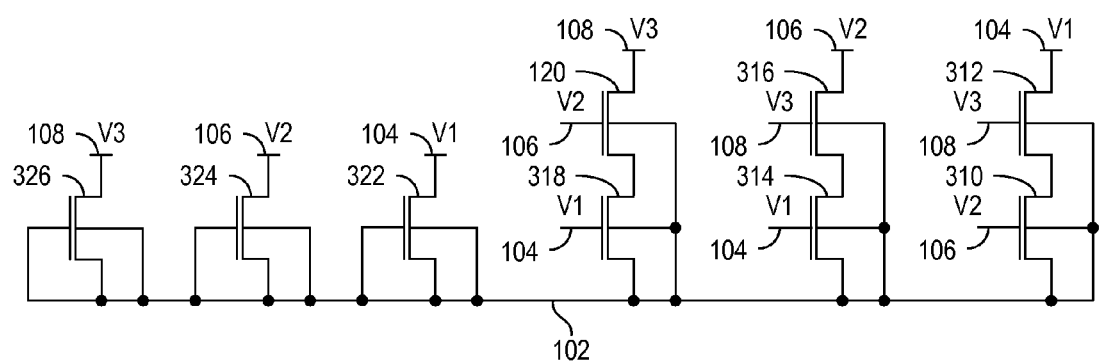
FIG. 3 is a block diagram of a circuit for biasing a well of an integrated circuit in accordance with various embodiments of the invention.

The embodiment of FIG. 1 shows p-type field effect transistors bias an n-type well to the highest of three input voltages. FIG. 3 shows an alternative embodiment having n-type field effect transistors bias a p-type well to the lowest of three input voltages. The NMOS transistors 310, 312, 314, 316, 318, 320, 322, 324, and 326 shown in FIG. 3 correspond to the PMOS transistors 110, 112, 114, 116, 118, 120, 122, 124, and 126 shown in FIG. 1.

The present invention is thought to be applicable to a variety of circuits for biasing a well of an integrated circuit. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A biasing circuit of an integrated circuit, comprising:
   a well of the integrated circuit; and
   a plurality of transistors disposed in the well and coupling the well to three signals providing corresponding voltages, the plurality of transistors including, for each of the three signals:
      a respective field-effect transistor coupled between the well and the signal through source and drain electrodes of the respective transistor, a gate electrode and a base electrode of the respective field-effect transistor coupled to the well; and
      a respective pair of field-effect transistors coupled in series between the well and the signal through source and drain electrodes of the respective pair of field-effect transistors, the two of the three signals other than the signal being coupled to a gate electrode of respective ones of the field-effect transistors in the respective pair; and
   wherein the transistors bias the well to an extreme one of the corresponding voltages of the three signals.

2. The circuit of claim 1, wherein the plurality of transistors bias the well to prevent forward biasing of a plurality of parasitic diodes.

3. The circuit of claim 2, further comprising an additional plurality of transistors that are disposed in the well and have source and drain electrodes that are coupled to the three signals, wherein each of the parasitic diodes couples one of the source and drain electrodes to the well.

4. The circuit of claim 3, wherein the three signals include a power supply signal and two input signals, and the plurality of transistors bias the well to prevent forward biasing of the parasitic diodes in response to the corresponding voltage of at least one of the input signals exceeding the corresponding voltage of the power supply signal.

5. The circuit of claim 4, wherein the two input signals are two inputs of the integrated circuit.

6. The circuit of claim 3, wherein the three signals include two power supply signals and an input signal, and the plurality of transistors bias the well to prevent forward biasing of the parasitic diodes in response to the corresponding voltage of the input signal exceeding the corresponding voltage of both of the power supply signals or in response to the corresponding voltage of one of the power supply signals exceeding the corresponding voltages of the input signal and another one of the power supply signals.

7. The circuit of claim 2, wherein the three signals include a power supply signal and two input signals, and the plurality of transistors bias the well to prevent forward biasing of the parasitic diodes in response to the corresponding voltage of at least one of the input signals exceeding the corresponding voltage of the power supply signal.

8. The circuit of claim 7, wherein the two inputs are two inputs of the integrated circuit.

9. The circuit of claim 2, wherein the three signals include two power supply signals and an input signal, and the plurality of transistors bias the well to prevent forward biasing of the parasitic diodes in response to the corresponding voltage of the input signal exceeding the corresponding voltage of both of the power supply signals or in response to the corresponding voltage of one of the power supply signals exceeding the corresponding voltages of the input signal and another one of the power supply signals.

10. The circuit of claim 1, wherein the transistors couple the well to the signal having the extreme corresponding voltage in response to a bias voltage of the well differing from the extreme corresponding voltage.

11. The circuit of claim 1, wherein the well is an n-type well and the transistors are p-channel field-effect transistors disposed in the n-type well and coupling the n-type well to the three signals for biasing the n-type well to the extreme corresponding voltage that is a highest one of the corresponding voltages for the three signals.

12. The circuit of claim 1, wherein the well is a p-type well and the transistors are n-channel field-effect transistors disposed in the p-type well and coupling the p-type well to the three signals for biasing the p-type well to the extreme corresponding voltage that is a lowest one of the corresponding voltages for the three signals.

13. The circuit of claim 1, wherein the transistors are metal-oxide-semiconductor (MOS) transistors having a base electrode that is coupled to the well.

14. The circuit of claim 1, wherein the transistors are adapted to bias the well with sufficient current to overcome a leakage current from the well.

15. The circuit of claim 1, wherein the respective field-effect transistors for the three signals couple the well to the signal having the extreme corresponding voltage in response to the extreme corresponding voltage exceeding a bias voltage of the well, and the respective pair of field-effect transistors for the three signals couple the well to the signal having the extreme corresponding voltage in response to the extreme corresponding voltage being exceeded by the bias voltage of the well.

16. The circuit of claim 15, the respective pair of field-effect transistors for the three signals couple the well to the signal having the extreme corresponding voltage in response to the extreme corresponding voltage exceeding the bias voltage of the well and both of the corresponding voltages of the three signals other than the signal.

17. A biasing circuit of an integrated circuit, comprising:
a well of the integrated circuit;
three pairs of a first and second field-effect transistor that are disposed in the well, each of the three pairs corresponding to a respective one of three input signals, each field-effect transistor of each pair having source and drain electrodes and gate and base electrodes, the two of the three input signals other than the respective input signal for each pair coupled to the gate electrode of respective ones of the field-effect transistors of the pair, the respective input signal coupled to the source electrode of the first field-effect transistor of each pair, the drain electrode of the first field-effect transistor of each pair coupled to the source electrode of the second field-effect transistor of the pair, the well coupled to the drain electrode of the second field-effect transistor of each pair and the base electrode of each transistor of each pair; and
three third field-effect transistors disposed in the well, each of the third field-effect transistors corresponding to a respective one of the three input signals, each third field-effect transistor having source and drain electrodes and gate and base electrodes, the respective input signal coupled to the source electrode of each third field-effect transistor, the well coupled to the drain electrode and the gate and base electrodes of each third field-effect transistor.

* * * * *